US007687854B2

(12) United States Patent
Park

(10) Patent No.: US 7,687,854 B2
(45) Date of Patent: Mar. 30, 2010

(54) TRANSISTOR IN A SEMICONDUCTOR SUBSTRATE HAVING HIGH-CONCENTRATION SOURCE AND DRAIN REGION FORMED AT THE BOTTOM OF A TRENCH ADJACENT TO THE GATE ELECTRODE

(75) Inventor: Nam Kyu Park, Cheongju-Shi (KR)

(73) Assignee: Magnachip Semiconductor, Ltd., Cheongju-Si, Chungcheongbuk-Do (KR)

( * ) Notice: Subject to any disclaimer, the term of this patent is extended or adjusted under 35 U.S.C. 154(b) by 31 days.

(21) Appl. No.: 10/876,729

(22) Filed: Jun. 28, 2004

(65) Prior Publication Data

US 2005/0040490 A1 Feb. 24, 2005

(30) Foreign Application Priority Data

Aug. 19, 2003 (KR) .................. 10-2003-0057120

(51) Int. Cl.
*H01L 29/78* (2006.01)
*H01L 21/336* (2006.01)

(52) U.S. Cl. .................. 257/344; 257/336; 257/408; 257/E29.267

(58) Field of Classification Search .......... 257/256, 257/328, 336, 344, 408, E29.267
See application file for complete search history.

(56) References Cited

U.S. PATENT DOCUMENTS

| 4,866,492 A * | 9/1989 | Quigg .................. 257/341 |
| 4,963,504 A * | 10/1990 | Huang .................. 438/305 |
| 5,403,763 A * | 4/1995 | Yamazaki .................. 438/268 |
| 5,484,743 A * | 1/1996 | Ko et al. .................. 438/291 |
| 5,538,909 A * | 7/1996 | Hsu .................. 438/301 |
| 5,693,542 A * | 12/1997 | Suh et al. .................. 438/151 |
| 5,798,291 A * | 8/1998 | Lee et al. .................. 438/301 |
| 5,828,103 A * | 10/1998 | Hsu .................. 257/344 |
| 5,834,793 A * | 11/1998 | Shibata .................. 257/25 |
| 5,981,343 A * | 11/1999 | Magri et al. .................. 438/268 |
| 5,981,998 A * | 11/1999 | Frisina et al. .................. 257/339 |
| 6,110,786 A * | 8/2000 | Gardner et al. .................. 438/300 |
| 6,198,129 B1 * | 3/2001 | Murakami .................. 257/339 |
| 6,531,347 B1 * | 3/2003 | Huster et al. .................. 438/164 |
| 6,656,764 B1 * | 12/2003 | Wang et al. .................. 438/104 |
| 6,897,570 B2 * | 5/2005 | Nakajima et al. .................. 257/786 |
| 6,906,381 B2 * | 6/2005 | Peyre-Lavigne et al. .... 257/333 |
| 2002/0045304 A1 * | 4/2002 | Lee .................. 438/201 |
| 2006/0286757 A1 * | 12/2006 | Power et al. .................. 438/305 |

FOREIGN PATENT DOCUMENTS

| JP | 02-005436 | | 1/1990 |
| JP | 03-156976 | * | 7/1991 |
| JP | 06-163572 | * | 6/1994 |

\* cited by examiner

*Primary Examiner*—Anh D Mai
(74) *Attorney, Agent, or Firm*—Lowe Hauptman Ham & Berner, LLP

(57) ABSTRACT

The present invention relates to a transistor in a semiconductor device and method of manufacturing the same. Trenches are formed in a semiconductor substrate at gate edges. Low-concentration impurity regions are then formed at the sidewalls and the bottoms of the trenches. High-concentration impurity regions are formed at the bottoms of the trenches in a depth shallower than the low-concentration impurity regions. Source/drain consisting of the low-concentration impurity regions and the high-concentration impurity regions are thus formed. Therefore, the size of the transistor can be reduced while securing a stabilized operating characteristic even at high voltage. It is thus possible to improve reliability of the circuit and the degree of integration in the device.

7 Claims, 4 Drawing Sheets

TRANSISTOR IN A SEMICONDUCTOR SUBSTRATE HAVING HIGH-CONCENTRATION SOURCE AND DRAIN REGION FORMED AT THE BOTTOM OF A TRENCH ADJACENT TO THE GATE ELECTRODE

BACKGROUND

1. Field of the Invention

The present invention relates to a transistor in a semiconductor device and method of manufacturing the same, and more specifically, to a transistor in a semiconductor device having a VDMOS (Vertical Diffused MOS) structure suitable for a high-voltage operation, and method of manufacturing the same.

2. Discussion of Related Art

A transistor used in a high-voltage device is fabricated in a structure different from a common transistor. For example, a transistor is manufactured to have an EDMOS (Extended Drain MOS) or LDMOS (Lateral Diffused MOS) structure so that the transistor can operate stably at high voltage. Of them, a transistor of the LDMOS structure (hereinafter, referred to as "LDMOS transistor") will be described.

FIG. 1 is a cross-sectional view for explaining the structure of a transistor in a semiconductor device in the related art.

Referring to FIG. 1, a LDMOS transistor includes a gate oxide film 104, a gate 105, dielectric film spacers 106 formed at the sidewalls of the gate 105, a source 107 and a drain 108. At this time, the source 107 has a low-concentration impurity region 107a and a high-concentration impurity region 107b, and the drain 108 has a low-concentration impurity region 108a and a high-concentration impurity region 108b. Unexplained reference numeral 102 indicates a well, 103 designates an isolation film and 109 indicates a well junction.

In the above, assuming that the size ($L_{LDMOS}$) of the LDMOS transistor is from the edge of the high-concentration impurity region 107b included in the source 107 to the edge of the high-concentration impurity region 108b included in the drain 108, the size ($L_{LDMOS}$) of the LDMOS transistor can be expressed into the following Equation 1.

$$L_{LDMOS} = 2L_D + 2L_{DO} + L_{GATE1} \quad \text{Equation 1}$$

where $L_D$ is a width from the edge of the high-concentration impurity region to the edge of the gate.

$L_{DO}$ is a width that the low-concentration impurity region and the gate are overlapped.

$L_{GATE1}$ is a channel width.

In the above, in order for the LDMOS transistor to stably operate even at high voltage, the low-concentration impurity regions 107a and 108a have to be extended in the horizontal direction. Thus, the size of the transistor is increased. For example, in order for the LDMOS transistor to stably operate even at about 40V, it is required that $L_D$ be at least 1.5 µm and $L_{GATE1}$ be at least 3 µm. At this time, assuming that $L_{DO}$ is 0.5 µm, the size of the LDMOS transistor becomes 7 µm.

If the channel width $L_{GATE1}$ is reduced, the size of the LDMOS transistor can be reduced but the electrical properties of the transistor can be degraded due to a short channel effect.

For this reason, it is difficult to apply the conventional LDMOS transistor to a high-integration circuit. In particular, there is a problem that the conventional LDMOS transistor is difficult to implement SOC (System On Chip).

SUMMARY OF THE INVENTION

Accordingly, the present invention has been made in view of the above problems, and it is an object of the present invention to provide a transistor in a semiconductor device and method of manufacturing the same, wherein trenches are formed in a semiconductor substrate at the edges of a gate, low-concentration impurity regions are formed at the sidewalls and the bottoms of the trenches, high-concentration impurity regions are formed at the bottoms of the trenches in a depth shallower than the low-concentration impurity regions, and source/drain consisting of the low-concentration impurity regions and the high-concentration impurity regions are thereby formed, thus reducing the size of the transistor while securing a stabilized operating characteristic even at high voltage and improving reliability of the circuit and the degree of integration in the device.

In order to accomplish the object, according to an aspect of the present invention, there is provided a transistor in a semiconductor device, comprising a gate oxide film formed at a given region of a semiconductor substrate, a gate formed on the gate oxide film, trenches formed in both side edges of the gate, and source/drain formed at the sidewalls and the bottoms of the trenches.

In the above, the transistor may further comprise dielectric film spacers formed at the sidewalls of the gate. The dielectric film spacers can be formed up to the sidewalls of the trenches.

The source/drain comprise low-concentration impurity regions formed at the sidewalls and the bottoms of the trenches, and high-concentration impurity regions formed at the bottoms of the trenches.

The transistor may further comprise a drift junction for controlling the threshold voltage, wherein the drift junction is formed in the semiconductor substrate under the gate.

According to a preferred embodiment of the present invention, there is provided a method of manufacturing a transistor in a semiconductor device, comprising the steps of providing a semiconductor substrate in which a well is formed in an active region and an isolation film is formed in an isolation region, forming low-concentration impurity regions in source/drain regions of the semiconductor substrate, forming trenches in the semiconductor substrate of the low-concentration impurity regions so that the trenches are adjacent to the isolation film, sequentially forming a gate oxide film and a gate on the semiconductor substrate between the trenches, and forming high-concentration impurity regions at the bottoms of the trenches to form source/drain having the low-concentration impurity regions and the high-concentration impurity regions.

It is preferred that the trenches are formed in a depth shallower than the low-concentration impurity regions and are formed in a width narrower below 5 µm than the width of the low-concentration impurity region.

The method may further comprise the step of forming a drift junction for controlling the threshold voltage in the semiconductor substrate between the low-concentration impurity regions before the gate oxide film is formed.

The method may further comprise the step of before the high-concentration impurity regions are formed, forming an insulating film on the entire surface and then performing a blanket etch process to form dielectric film spacers at the sidewalls of the gate.

DETAILED DESCRIPTION OF PREFERRED EMBODIMENTS

Figure 1:
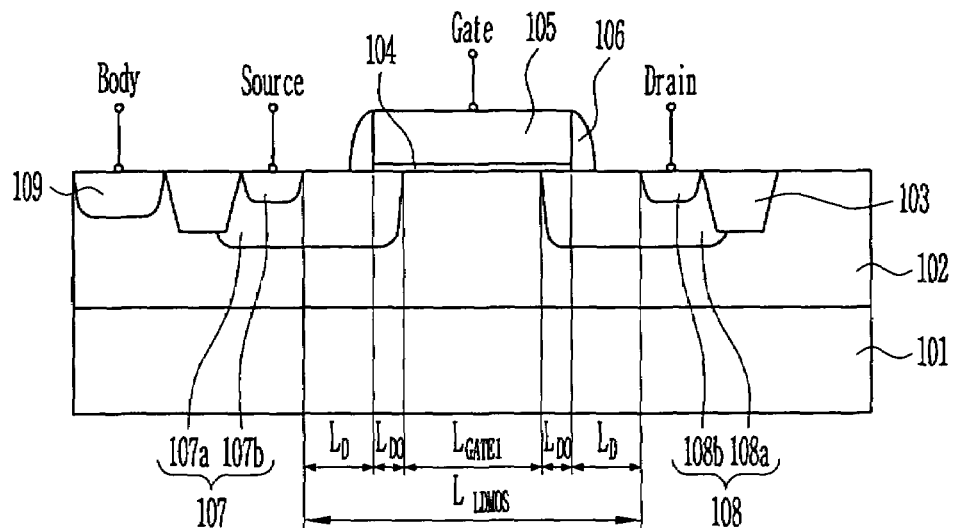
FIG. 1 is a cross-sectional view for explaining the structure of a transistor in a semiconductor device in the related art.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. Or, a third film may be intervened between the one film and the other film or the semiconductor substrate. Further, in the drawing, the thickness and size of each layer are exaggerated for convenience of explanation and clarity. Like reference numerals are used to identify the same or similar parts.

Figure 2:
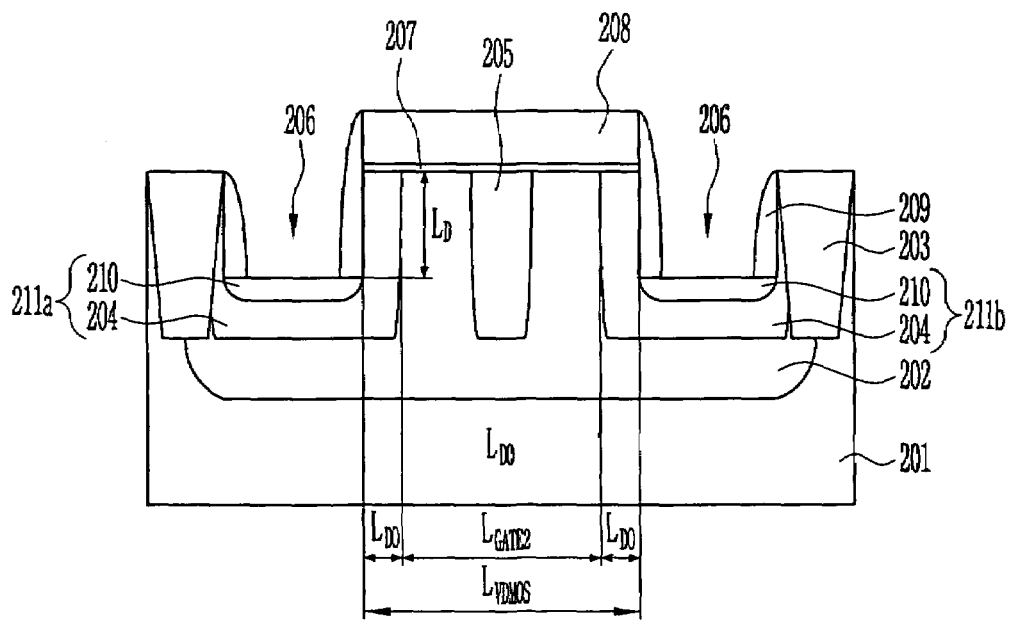
FIG. 2 is a cross-sectional view for explaining the structure of a transistor in a semiconductor device according to an embodiment of the present invention.

FIG. 2 is a cross-sectional view for explaining the structure of a transistor in a semiconductor device according to an embodiment of the present invention.

Referring to FIG. 2, the transistor in the semiconductor device according to an embodiment of the present invention includes a gate oxide film 207 and a gate 208 which are sequentially stacked at a given region, trenches 206 formed at both side edges of the gate 208, and source and drain 211a and 211b formed at the sidewalls and the bottoms of the trenches 206.

In the above, each of the source and drain 211a and 211b has a structure including a low-concentration impurity region 204 formed at the sidewall and the bottom of the trench 206, and a high-concentration impurity region 210 formed only at the bottom of the trench 206.

Meanwhile, dielectric film spacers 209 are further formed at the sidewalls of the gate 208. The dielectric film spacers 209 can be formed up to both sidewalls of the trenches 206.

Furthermore, in order to control the threshold voltage of the transistor, a drift junction 205 can be further formed in the semiconductor substrate 201 under the gate 208. By providing the drift junction 205 such as a threshold voltage ion implantation layer, a channel width of the transistor can become further narrow. It is thus possible to improve the degree of integration in the device.

The size of the VDMOS transistor formed thus according to an embodiment of the present invention will now be compared with that of the conventional LDMOS transistor.

In the same manner that the size of the LDMOS transistor is defined in FIG. 1, assuming that the size ($L_{VDMOS}$) of the VDMOS transistor is from the edge of the high-concentration impurity region 210 included in the source 211a to the edge of the high-concentration impurity region 210 included in the drain 211b, the size ($L_{VDMOS}$) of the VDMOS transistor can be expressed into the following Equation 2.

$$L_{VDMOS} = 2L_{DO} + L_{GATE2} \qquad \text{Equation 2}$$

where $L_{DO}$ is a width that the low-concentration impurity region and the gate are overlapped.

$L_{GATE2}$ is a channel width.

Referring to Equation 2, in the VDMOS transistor according to an embodiment of the present invention, the high-concentration impurity region 210 and the gate 208 are adjacent in the horizontal direction and are spaced only in the vertical direction. A distance ($L_D$) between the edge of the high-concentration impurity region and the edge of the gate does not affect the size of the VDMOS transistor.

In the above, a difference between the size of the conventional LDMOS transistor and the size of the VDMOS transistor according to the present invention will be compared with reference to Equation 1 and Equation 2. The difference (Δ) can be expressed into the following Equation 3.

$$\Delta = 2L_D + (L_{GATE1} - L_{GATE2}) \qquad \text{Equation 3}$$

Referring to Equation 3, in order for the VDMOS transistor to stably operate even at about 40V, it is required that $L_D$ be a minimum of 1.5 μm like in the prior art. Also, $L_{GATE2}$ becomes 2 μm that is narrower than in the LDMOS transistor by means of the drift junction 205. The difference (Δ) between the size of the conventional LDMOS transistor and the size of the VDMOS transistor according to the present invention is 4 μm. That is, the size of the VDMOS transistor according to the present invention can be further reduced by about 4 μm compared to the size of the conventional LDMOS transistor.

A method of manufacturing the VDMOS transistor formed above will now be described.

FIG. 3A to FIG. 3F are cross-sectional views for explaining a method of manufacturing a transistor in a semiconductor device according to an embodiment of the present invention.

Figure 3A:
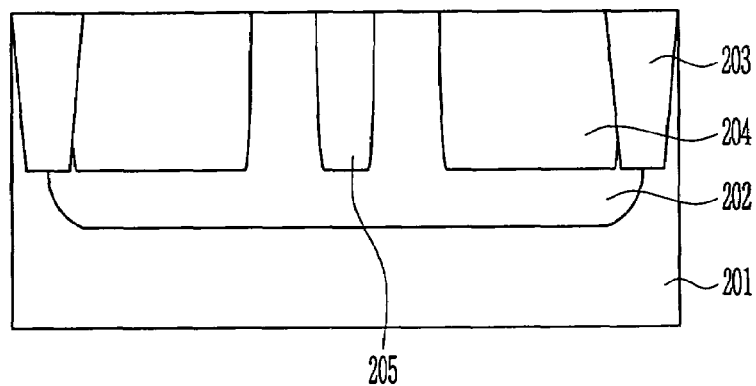
FIG. 3A to FIG. 3F are cross-sectional views for explaining a method of manufacturing a transistor in a semiconductor device according to an embodiment of the present invention.

Referring to FIG. 3A, a well 202 is formed at an active region of a semiconductor substrate 201.

In the above, the well 202 can be formed in a region where an N channel transistor is to be formed, in a triple well structure consisting of a triple N well into which boron (B) is implanted and a P well into which phosphorus (P) is implanted. The well 202 can be formed in a region where a P channel transistor is to be formed using an N well into which phosphorous is implanted. As above, after the impurity is implanted, an annealing process is implemented so that secondary drive-in is realized.

Thereafter, in the active region, low-concentration impurity regions 204 are formed in regions where source and drain will be formed. At this time, if an N channel transistor is formed, arsenic (As) can be implanted to form the low-concentration impurity regions 204. If a P channel transistor is formed, $BF_2$ can be implanted to form the low-concentration impurity regions 204. After the impurity is implanted, an annealing process is performed so that secondary drive-in is realized in order to form a vertically diffused source/drain.

Meanwhile, it has been shown in the drawing that the low-concentration impurity regions 204 are formed in all the regions where the source and drain will be formed. The low-concentration impurity regions 204, however, can be formed only in a region where the drain will be formed.

Next, in order to control the threshold voltage of the transistor, a drift junction 205 is formed in a portion of the channel region between the low-concentration impurity regions 204. In case of the N channel transistor, $BF_2$ can be implanted to form the drift junction 205. In case of the P channel transistor, arsenic (As) can be implanted to form the drift junction 205. After the impurity is implanted as such, an annealing process is performed so that the secondary drive-in is accomplished, thus forming the drift junction 205 of a depth to the extent that the transistor can stably operate even at high voltage.

Thereafter, trenches are formed in an isolation region by means of a STI (Shallow Trench Isolation) process. The trenches are then filled with an insulating material, forming isolation films 203.

Figure 3B:
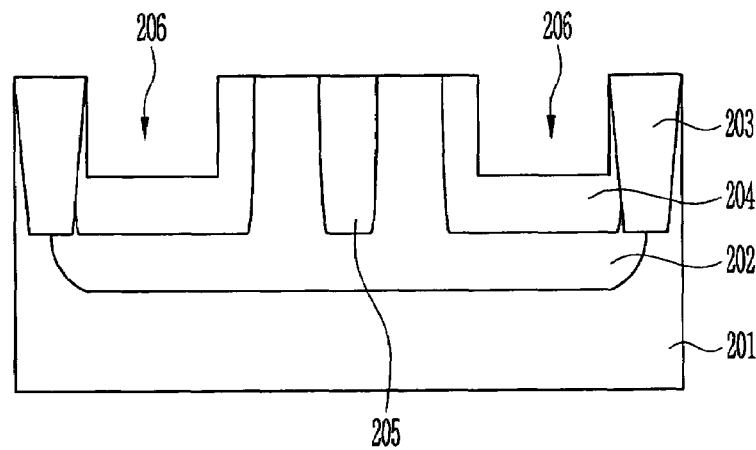

Referring to FIG. 3B, some regions of the low-concentration impurity regions 204 are etched to form trenches 206. At this time, it is preferred that the trenches 206 are formed in a depth shallower than the low-concentration impurity regions 204 and are close to the isolation films 203.

In the above, the trenches 206 are formed in a width narrower than the low-concentration impurity regions 204. It is preferable that the width at non-etched portions of the low-concentration impurity regions 204 is determined to be suitable for the operating voltage. For example, the trenches 206 are formed in a width narrower about 0.5 μm than the low-concentration impurity regions 204. The degree that a gate to be formed in a subsequent process and the low-concentration impurity regions 204 are overlapped on the surface of the semiconductor substrate 201 is preferably controlled below 0.5 μm. Meanwhile, the depth of the trench 206 can be determined considering the operating voltage and distribution of an electric field. If the operating voltage is about 40V, it is preferred that the depth of the trench 206 is set to 1 μm to 2 μm.

Figure 3C:
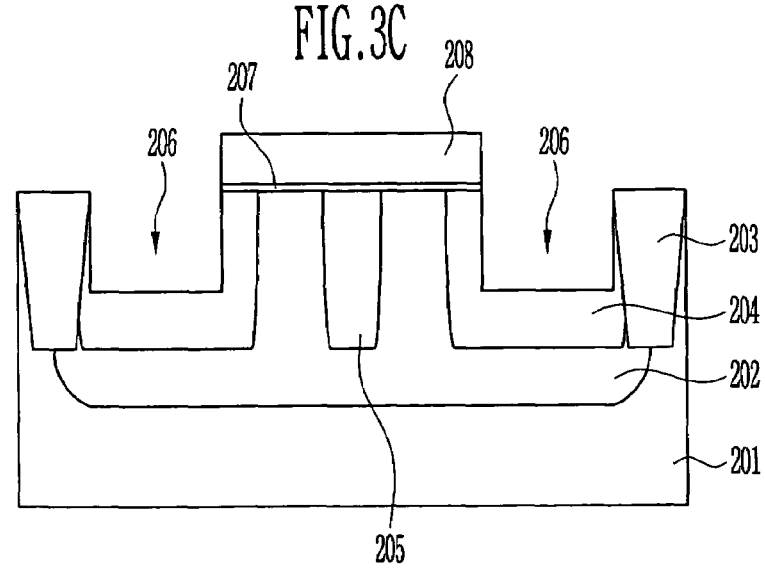

By reference to FIG. 3C, a gate oxide film 207 and a gate 208 are sequentially formed on the active region of the semiconductor substrate 201 in which the trench 206 is not formed. At this time, a thickness of the gate oxide film 207 is determined depending on the operating voltage. Meanwhile, the gate 208 may be formed using polysilicon and is overlapped with the low-concentration impurity regions 204 within about 5 μm.

Figure 3D:
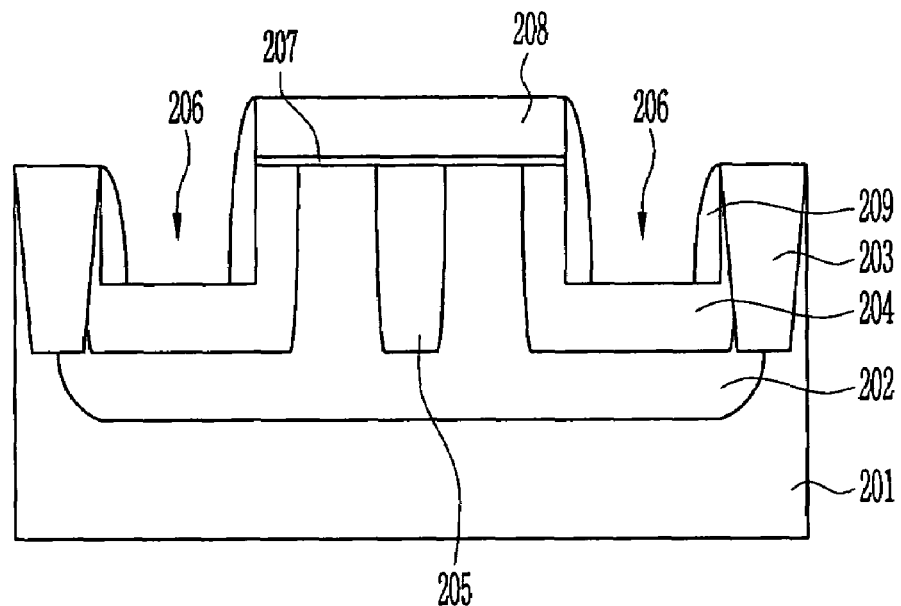

Referring to FIG. 3D, after an insulating film is formed on the entire surface, a dry etch process is performed to form dielectric film spacers 209. In this case, it is preferred that the insulating film is formed using HLD (High Pressure Low temperature Decomposition) oxide. Meanwhile, since the dielectric film spacers 209 are formed with the trenches 206 formed, the dielectric film spacers 209 are formed even at the sidewalls of the trenches 206.

Figure 3E:
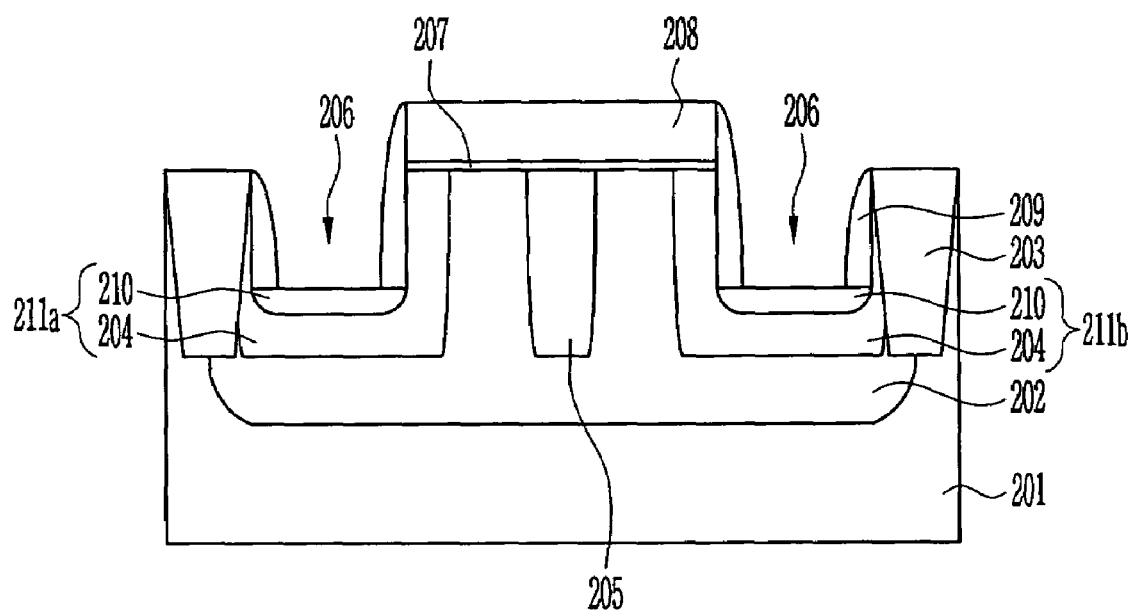

Referring to FIG. 3E, an impurity ion implantation process is performed at a concentration higher than the impurity implanted in order to form the low-concentration impurity regions 204, thereby forming high-concentration impurity regions 210. At this time, if an N channel transistor is formed, arsenic (As) can be implanted to form the high-concentration impurity regions 210. If a P channel transistor is formed, $BF_2$ can be implanted to form the high-concentration impurity regions 210. After the impurity is formed, an annealing process is performed so that the implanted impurity is activated.

Meanwhile, the impurity ion implantation process of the high concentration is performed with the gate 208 and the bottoms of the trenches 206 exposed. Thus, the high-concentration impurity regions 210 are formed only at the bottoms of the trenches 206 in a self-aligned manner. The impurity of the high concentration is also implanted into the gate 208.

Thereby, source and drain 211a and 211b consisting of the low-concentration impurity regions 204 formed at the sidewalls and the bottoms of the trenches 206 and the high-concentration impurity regions 210 formed only at the bottoms of the trenches 206 are formed.

Through the above process, the VDMOS transistor according to an embodiment of the present invention is manufactured.

Figure 3F:
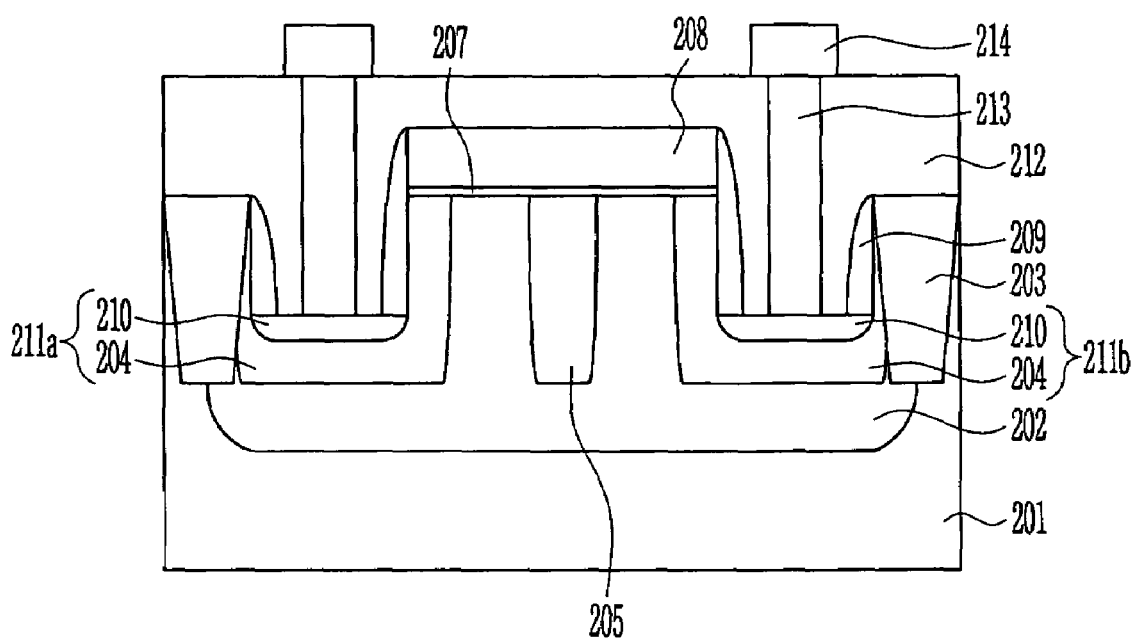

By reference to FIG. 3F, an interlayer insulating film 212 is formed on the entire surface. A contact hole is then formed in the interlayer insulating film 212 by means of an etch process so that the junction of the semiconductor substrate 201 including the source/drain 211a and 211b is exposed. After the contact hole is filled with a conductive material to form contact plugs 213, a metal wire 214 of a given pattern is formed on the interlayer insulating film 212 including the contact plugs 213. At this time, the contact plugs can be formed using a conductive material such as polysilicon or tungsten.

The VDMOS transistor formed through the aforementioned method will now be examined. There is an effect that an electric field is distributed between the low-concentration impurity regions 204 formed in the vertical direction and the contact plugs 213 formed on the drain 211b. If the low-concentration impurity regions 204 formed in the vertical direction do not exist, there will a problem that a voltage applied to the drain 211b is concentrated on the edges of the high-concentration impurity regions 210 and the low-concentration impurity regions 204 on the horizontal line.

Furthermore, if the gate 208 is formed on the horizontal line not the VDMOS structure, an electric field is applied between the corners of the low-concentration impurity regions 204 and the edges of the gate 208. As a gate oxide film breakdown occurs at a very low voltage, it is not suitable for the object of a high voltage.

Furthermore, the vertically diffused drift junction 205 becomes a resisting body having distributed resistance due to a low doping concentration, thus help a high-voltage operation while serving to lower the voltage applied to the drain.

According to the present invention described above, trenches are formed in a semiconductor substrate of gate edges. Low-concentration impurity regions are formed at the sidewalls and the bottoms of the trenches. High-concentration impurity regions are formed at the bottoms of the trenches in a depth shallower than the low-concentration impurity regions. Source/drain consisting of the low-concentration impurity regions and the high-concentration impurity regions are thus formed. Therefore, the size of the transistor can be reduced while securing a stabilized operating characteristic even at high voltage. It is thus possible to improve reliability of the circuit and the degree of integration in the device.

What is claimed is:

1. A transistor in a semiconductor device, comprising:
a well formed by a first conductivity type impurity in an active region of a semiconductor substrate;
a low-concentration impurity region formed by a second conductivity type impurity on the active region;
a gate oxide film and a gate formed over a surface of the semiconductor substrate;
an isolation region formed in the semiconductor substrate;
a trench surrounded by the low-concentration impurity region;
dielectric film spacers formed on both sidewalls of the gate and the trench;
a high-concentration impurity region formed by the second conductivity type impurity at the bottom of the trench and the dielectric film spacers to form source/drain regions; and
a drift junction formed in a portion of a channel region in the well by a same dopant type of impurity as an impurity of the well, wherein the high-concentration impurity region is formed to have a distance 1.0 μm to 2.0 μm, when the transistor stably operates at substantially 40 V, from a bottom surface of the gate oxide film in a vertical direction.

2. The transistor as claimed in claim 1, wherein the high-concentration impurity region is formed only at the trench in a self-aligned manner.

3. The transistor as claimed in claim 1, wherein the trench is formed between the gate and an adjacent isolation region.

4. The transistor as claimed in claim 1, further comprising:
an interlayer insulating film formed over the semiconductor substrate;
a contact plug formed on each a source/drain through the interlayer insulating film;
a metal wire formed on the interlayer insulating film including the contact plug.

5. The transistor as claimed in claim 1, wherein a height of a dielectric film spacer formed adjacent the gate is higher than a height of a dielectric film spacer formed adjacent the trench.

6. The transistor as claimed in claim 1, wherein a size ($L_{VDMOS}$) of the transistor is formed to satisfy the following:
$L_{VDMOS} = 2L_{DO} + L_{GATE2}$, wherein $L_{DO}$ is a width for which the low-concentration impurity region and the gate are overlapped, and $L_{GATE2}$ is a channel width.

7. The transistor as claimed in claim 1, wherein the trench has a width narrower than the low-concentration impurity region, and a depth of the trench is shallower than a depth of the low-concentration impurity region.

* * * * *